(12) United States Patent
Sawada

(10) Patent No.: US 9,620,354 B2
(45) Date of Patent: Apr. 11, 2017

(54) METHOD FOR MANUFACTURING SEMICONDUCTOR SUBSTRATE WITH DIFFUSION AGENT COMPOSITION

(71) Applicant: TOKYO OHKA KOGYO CO., LTD., Kawasaki (JP)

(72) Inventor: Yoshihiro Sawada, Kawasaki (JP)

(73) Assignee: TOKYO OHKA KOGYO CO., LTD., Kawasaki-shi (JP)

( * ) Notice: Subject to any disclaimer, the term of this patent is extended or adjusted under 35 U.S.C. 154(b) by 0 days.

(21) Appl. No.: 14/872,714

(22) Filed: Oct. 1, 2015

(65) Prior Publication Data

US 2016/0099149 A1 Apr. 7, 2016

(30) Foreign Application Priority Data

Oct. 3, 2014 (JP) ................. 2014-205252
Jul. 1, 2015 (JP) ................. 2015-132821
Sep. 29, 2015 (JP) ................. 2015-192333

(51) Int. Cl.
*H01L 21/02* (2006.01)
*H01L 21/22* (2006.01)
*H01L 21/225* (2006.01)
*H01L 21/228* (2006.01)

(52) U.S. Cl.
CPC ........ *H01L 21/0206* (2013.01); *H01L 21/228* (2013.01); *H01L 21/2225* (2013.01); *H01L 21/2255* (2013.01)

(58) Field of Classification Search
CPC .............. H01L 21/225; H01L 21/0206; H01L 21/2225; H01L 21/228; H01L 21/2255
See application file for complete search history.

(56) References Cited

U.S. PATENT DOCUMENTS

| 2001/0024728 A1 | 9/2001 | Kamitani et al. |
| 2010/0081264 A1 | 4/2010 | Leung et al. |
| 2013/0280883 A1 | 10/2013 | Faul et al. |
| 2014/0227865 A1* | 8/2014 | Kamizono .......... H01L 21/2225 438/562 |
| 2015/0325442 A1* | 11/2015 | Wiedmann ............ H01L 21/225 438/542 |

FOREIGN PATENT DOCUMENTS

| JP | H06-318559 | 11/1994 |
| JP | 2005-347306 A | 12/2005 |
| WO | WO2014/064873 | 5/2014 |

OTHER PUBLICATIONS

Office Action in U.S. Appl. No. 15/085,657, dated Aug. 24, 2016.
Office Action in U.S. Appl. No. 15/085,657, dated Jan. 30, 2017.

* cited by examiner

*Primary Examiner* — John P Dulka
*Assistant Examiner* — Charles R Peters
(74) *Attorney, Agent, or Firm* — Knobbe, Martens, Olson & Bear LLP

(57) ABSTRACT

A method for manufacturing a semiconductor substrate. An impurity diffusion ingredient can be diffused well and uniformly from a coating film into a semiconductor substrate by forming a coating film having a thickness of not more than 30 nm on a surface of a semiconductor substrate with a diffusion agent composition containing an impurity diffusion ingredient and a silicon compound that can be hydrolyzed to produce a silanol group.

6 Claims, No Drawings

METHOD FOR MANUFACTURING SEMICONDUCTOR SUBSTRATE WITH DIFFUSION AGENT COMPOSITION

This application claims priority to Japanese Patent Application Nos. 2014-205252, 2015-132821 and 2015-192333, filed Oct. 3, 2014, Jul. 1 2015, and Sep. 29 2015, respectively, the contents of which are incorporated herein by reference.

BACKGROUND OF THE INVENTION

Field of the Invention

The present invention relates to a method for manufacturing a semiconductor substrate, wherein an impurity diffusion ingredient is diffused into a semiconductor substrate through a thin film formed using a diffusion agent composition comprising an impurity diffusion ingredient and an Si (silicon) compound that can be hydrolyzed to produce a silanol group.

Related Art

Semiconductor substrates used in semiconductor elements such as transistors diodes and solar batteries are manufactured by diffusing impurity diffusion ingredients such as phosphorus and boron into the semiconductor substrates. For such semiconductor substrates, in the manufacture of semiconductor substrates for multigate elements such as Fin-FET and nanowire FET, in some cases, for example, impurities are diffused into semiconductor substrates having on their surface a three-dimensional structure having nanometer-scale microvoids.

For example, ion implantation (see, for example, Patent Document 1) and CVD (see, for example, Patent Document 2) are known as methods for the diffusion of an impurity diffusion ingredient into the semiconductor substrate. In the ion implantation method, an ionized impurity diffusion ingredient is implanted into a surface of a semiconductor substrate. In the CVD method, an impurity diffusion ingredient is diffused from an oxide film into a semiconductor substrate by forming an oxide film of silicon oxide or the like doped with impurity diffusion ingredients such as phosphorus and boron by CVD and then heating the semiconductor substrate with the oxide film formed thereon in an electric furnace or the like.

Patent Document 1: Japanese Unexamined Patent Application, Publication No. H06-318559
Patent Document 2: PCT International Publication No. WO2014/064873

SUMMARY OF THE INVENTION

The ion implantation method as described in Patent Document 1 is disadvantageous in that, when light ions such as B (boron) ions are implanted into a semiconductor substrate, point defects or point defect clusters are likely to be formed in an area near the surface of the substrate and, in the implantation of heavy ions such as As (arsenic) ions, a noncrystalline area is likely to be formed in an area near the surface of the substrate. For example, when CMOS elements such as CMOS image sensors are formed by diffusing an impurity diffusion ingredient into a semiconductor substrate by the ion implantation method, the occurrence of such defects is directly linked to deterioration of performance of elements. When such defects occur in CMOS image sensors, a problem of void occurs.

Further, when the semiconductor substrate has on its surface a three-dimensional structure such as a nano-scale three-dimensional structure for the formation of a multigate element called Fin-FET comprising a plurality of source fins, a plurality of drain fins, and a gate vertical to these fins, in the ion implantation method, difficulties are encountered in uniformly implanting ions into a side surface and an upper surface of the fins and the gate, and the whole inner surface of concaves surrounded by the fins and the gate.

In the diffusion of the impurity diffusion ingredient by the ion implantation method into the semiconductor substrate having a nano-scale three-dimensional structure, even when ions could have been uniformly implanted, the following problem occurs. For example, when logic LSI devices and the like are formed using a semiconductor substrate having a three-dimensional pattern comprising fine fins, crystals of substrate materials such as silicon are likely to be broken by ion implantation. Such damage to the crystals is considered to cause problems of a variation in properties of the device and the occurrence of stand-by leak current.

Further, the application of the CVD method as described in Patent Document 2 poses a problem of, due to an overhang phenomenon, difficulties encountered in covering the whole inner surface of concaves surrounded by the fins and the gate with an oxide film that is uniform in thickness and contains an impurity diffusion ingredient, as well as a problem of an oxide being deposited in openings of concaves surrounded by the fins and the gate thereby blocking the openings. Thus, in the ion implantation method and the CVD method, an impurity diffusion ingredient cannot be diffused well and uniformly on semiconductor substrates without difficulties, depending upon surface shapes of the semiconductor substrate.

The present invention has been made in view of the above problems, and an object of the present invention is to provide a method for producing a semiconductor substrate, the method being advantageous in that, even when a semiconductor substrate having on its surface a three-dimensional structure with nanometer-scale microvoids is used, an impurity diffusion ingredient can be diffused well and uniformly on the semiconductor substrate on its whole area including the whole inner surface of microvoids where a diffusion agent composition for a semiconductor substrate has been applied while suppressing the occurrence of defects on the semiconductor substrate.

The present inventors have drawn an attention to a fact that, when an impurity diffusion ingredient is diffused into a semiconductor substrate by heating a coating film formed of a coating-type diffusion agent composition, the occurrence of defects in the semiconductor substrate observed in the ion implantation method can be suppressed, and the present inventors have made studies on this matter. As a result, the present inventors have found that the use of a diffusion agent composition comprising an impurity diffusion ingredient (A) and an Si compound (B) that can be hydrolyzed to produce a silanol group, can allow the impurity diffusion ingredient to be well and uniformly diffused from the coating film into the semiconductor substrate even when a coating film having a thickness of not more than 30 nm is formed on the surface of the semiconductor substrate using the diffusion agent composition, leading to the completion of the present invention.

Specifically, the present invention is related to a method for manufacturing a semiconductor substrate into which an impurity diffusion ingredient (A) is diffused, the method comprising:
forming a coating film having a thickness of not more than 30 nm by coating a diffusion agent composition on to a semiconductor substrate; and diffusing the impurity diffusion ingredient (A) contained in the diffusion agent composition into the semiconductor substrate, wherein the diffusion agent composition comprises the impurity diffusion ingredient (A) and an Si (silicon) compound (B), and the Si compound (B) can be hydrolyzed to produce a silanol group.

The present invention can provide a method for producing a semiconductor substrate, the method being advantageous in that, even when a semiconductor substrate having on its surface a three-dimensional structure with nanometer-scale microvoids is used, an impurity diffusion ingredient can be diffused well and uniformly on the semiconductor substrate on its whole area including the whole inner surface of microvoids where a diffusion agent composition for a semiconductor substrate has been applied while suppressing the occurrence of defects on the semiconductor substrate.

DETAILED DESCRIPTION OF THE INVENTION

The method for producing a semiconductor substrate according to the present invention comprises: a coating step of coating a diffusion agent composition onto a semiconductor substrate to form a coating film having a thickness of not more than 30 nm; and a diffusion step of diffusing an impurity diffusion ingredient (A) contained in the diffusion agent composition into the semiconductor substrate. The diffusion agent composition contains the impurity diffusion ingredient (A) and an Si (silicon) compound (B) that can be hydrolyzed to produce a silanol group. Next, the coating step and the diffusion step will be described hereinafter in that order.

Coating Step

In the coating step, a diffusion agent composition is applied onto a semiconductor substrate to form a coating film having a thickness of not more than 30 nm. For the coating step, diffusion agent compositions, semiconductor substrates, and coating methods will be described in that order.

Diffusion Agent Composition

The diffusion agent composition contains an impurity diffusion ingredient (A) and an Si (silicon) compound (B) that can be hydrolyzed to produce a silanol group. In the present specification, the Si compound (B) that can produce a silanol group will be referred to also as a hydrolyzable silane compound (B). Indispensable or optional ingredients contained in the diffusion agent composition will be described hereinafter.

[Impurity Diffusion Ingredient (A)]

The impurity diffusion ingredient (A) is not particularly limited as long as the ingredient is one that has hitherto been used for doping of semiconductor substrates. The impurity diffusion ingredient (A) may be either an n-type dopant or a p-type dopant. Elementary substances such as phosphorus, arsenic, and antimony and compounds containing these elements may be mentioned as the n-type dopant. Elementary substances such as boron, gallium, indium, and aluminum and compounds containing these elements may be mentioned as the p-type dopant.

The impurity diffusion ingredient (A) is preferably a phosphorus compound, a boron compound, or an arsenic compound from the viewpoints of easy availability and easy handleability. Preferred phosphorus compounds include phosphoric acid, phosphorous acid, hypophosphorous acid, polyphosphoric acid, and diphosphorus pentaoxide, phosphorous acid esters, phosphoric acid esters, phosphorous acid tris (trialkylsilyl), and phosphoric acid tris (trialkylsilyl). Preferred boron compounds include boric acid, metaboric acid, boronic acid, perboric acid, hypoboric acid, diboron trioxide, and trialkyl borate. Preferred arsenic compounds include arsenic acid and trialkyl arsenate.

Preferred phosphorus compounds include phosphorous acid esters, phosphoric acid esters, tris(trialkylsilyl) phosphite, and tris(trialkylsilyl) phosphate. Among these, trimethyl phosphate, triethyl phosphate, trimethyl phosphite, triethyl phosphite, tris(trimethoxysilyl) phosphate, and tris(trimethoxysilyl) phosphite are preferred. Trimethyl phosphate, trimethyl phosphite, and tris(trimethylsilyl) phosphate are more preferred, and trimethyl phosphate is particularly preferred.

Preferred boron compounds include trimethoxyboron, triethoxyboron, trimethylboron, and triethylboron.

Preferred arsenic compounds include arsenic acid, triethoxyarsenic, and tri-n-butoxyarsenic.

The content of the impurity diffusion ingredient (A) in the diffusion agent composition is not particularly limited. The content of the impurity diffusion ingredient (A) in the diffusion agent composition is such that the amount (moles) of elements that act as a dopant in a semiconductor substrate such as phosphorus, arsenic, antimony, boron, gallium, indium, and aluminum contained in the impurity diffusion ingredient (A) is preferably 0.01 to 5 times, more preferably 0.05 to 3 times, of the number of moles of Si contained in the hydrolyzable silane compound (B).

[Hydrolyzable Silane Compound (B)]

The diffusion agent composition contains a hydrolyzable silane compound (B). By virtue of this constitution, when the diffusion agent composition is applied onto a semiconductor substrate to form a thin film, the hydrolyzable silane compound is subjected to hydrolysis condensation to form a silicon oxide-based very thin film within the coating film. When the silicon oxide-based very thin film is formed within the coating film, external diffusion of the impurity diffusion ingredient (A) on the outside of the substrate is suppressed. In this case, even when the film of the diffusion agent composition is a thin film, the impurity diffusion ingredient (A) is diffused well and uniformly into the semiconductor substrate.

The hydrolyzable silane compound (B) produces a hydroxyl group as a result of hydrolysis and has a functional group bondable to a Si atom. Functional groups that produce a hydroxyl group as a result of hydrolysis include alkoxy, isocyanate, and dimethylamino groups and halogen atoms. Straight-chain or branched-chain aliphatic alkoxy groups having 1 to 5 carbon atoms are preferred as the alkoxy group. Specific examples of suitable alkoxy groups include methoxy, ethoxy, n-propoxy, isopropoxy, and n-butoxy groups. Preferred halogen atoms are chlorine, fluorine, bromine, and iodine atoms, and the chlorine atom is more preferred.

The functional group that produces a hydroxyl group as a result of hydrolysis is preferably an isocyanate group and straight-chain or branched-chain aliphatic alkoxy group having 1 to 5 carbon atoms, more preferably methoxy, ethoxy, and isocyanate groups, from the viewpoints of rapid hydrolysis and handleability and availability of the hydrolyzable silane compound (B).

Specific examples of the hydrolyzable silane compound (B) having a straight-chain or branched-chain aliphatic alkoxy groups having 1 to 5 carbon atoms include tetramethoxysilane, tetraethoxysilane, tetra-n-propoxysilane, tetraisopropoxysilane, tetra-n-butoxysilane, tetra-n-pentyloxysilane, trimethoxymonoethoxysilane, dimethoxydiethoxysilane, monomethoxytriethoxysilane, trimethoxymono-n-propoxysilane, dimethoxydi-n-propoxysilane, monomethoxytri-n-propoxysilane, trimethoxymono-n-butoxysilane, dimethoxydi-n-butoxysilane, monomethoxytri-n-tributoxysilane, trimethoxymono-n-pentyloxysilane, dimethoxydi-n-pentyloxysilane, monomethoxytri-n-pentyloxysilane, triethoxymono-n-propoxysilane, diethoxydi-n-propoxysilane, monoethoxytri-n-propoxysilane, triethoxymono-n-butoxysilane, diethoxydi-n-butoxysilane, monoethoxytri-n-butoxysilane, triethoxymono-n-pentyloxysilane, diethoxydi-n-pentyloxysilane, monoethoxytri-n-pentyloxysilane, tri-n-propoxy-mono-n-butoxysilane, di-n-propoxydi-n-butoxysilane, mono-n-propoxytri-n-propoxysilane, tri-n-propoxy mono-n-pentyloxysilane, di-n-propoxydi-n-pentyloxysilane, mono-n-propoxytri-n-pentyloxysilane, tri-n-butoxy mono-n-pentyloxysilane, di-n-butoxydi-n-pentyloxysilane, mono-n-butoxytri-n-pentyloxysilane, methyltrimethoxysilane, methyltriethoxysilane, methyltri-n-propoxysilane, methyltri-n-propoxysilane, methyltri-n-butoxysilane, methyltri-n-pentyloxysilane, ethyltrimethoxysilane, ethyltriethoxysilane, ethyltri-n-propoxysilane, ethyltri-n-butoxysilane, and ethyltri-n-pentyloxysilane. These hydrolyzable silane compounds (B) may be used solely or in a combination of two or more of these. Further, partial hydrolyzates of the alkoxysilane compounds may also be used as the hydrolyzable silane compound (B).

Among these, tetramethoxysilane, tetraethoxysilane, methyltrimethoxysilane, methyltriethoxysilane, ethyltrimethoxysilane, and ethyltriethoxysilane are preferred, and tetramethoxysilane and tetraethoxysilane are particularly preferred.

Compounds represented by the following formula (1) are preferred as the isocyanate-group-containing hydrolyzable silane compound (B).

$$R_{4-n}Si(NCO)_n \quad (1)$$

wherein R represents a hydrocarbon group; and n is an integer of 3 or 4.

The hydrocarbon group as R in the formula (1) is not particularly limited as long as the object of the present invention is not impeded. Aliphatic hydrocarbon groups having 1 to 12 carbon atoms, aromatic hydrocarbon groups having 1 to 12 carbon atoms, and aralkyl groups having 1 to 12 carbon atoms are preferred as R.

Examples of suitable aliphatic hydrocarbon groups having 1 to 12 carbon atoms include methyl, ethyl, n-propyl, isopropyl, n-butyl, sec-butyl, isobutyl, tert-butyl, n-pentyl, isopentyl, neopentyl, cyclopentyl, n-hexyl, cyclohexyl, n-heptyl, n-cycloheptyl, n-octyl, n-cyclooctyl, n-nonyl, n-decyl, n-undecyl, and n-dodecyl groups.

Examples of suitable aromatic hydrocarbon groups having 1 to 12 carbon atoms include phenyl, 2-methylphenyl, 3-methylphenyl, 4-methylphenyl, 2-ethylphenyl, 3-ethylphenyl, 4-ethylphenyl, α-naphthyl, β-naphthyl, and biphenylyl groups.

Examples of suitable aralkyl groups having 1 to 12 carbon atoms include benzyl, phenetyl, α-naphthylmethyl, β-naphthylmethyl, 2-α-naphthylethyl, and 2-β-naphthylethyl groups.

Among the above-described hydrocarbon atoms, methyl and ethyl groups are preferred, and a methyl group is more preferred.

Among the hydrolyzable silane compounds (B) represented by the formula (1), tetraisocyanatesilane, methyltrii-socyanatesilane, and ethyltriisocyanatesilane are preferred, and tetraisocyanatesilane is more preferred.

The hydrolyzable silane compound (B) containing an isocyanate group and the hydrolyzable silane compound (B) containing a straight-chain or branched-chain aliphatic alkoxy group having 1 to 5 carbon atoms may also be used in combination. In this case, the ratio X/Y between the number of moles X of the hydrolyzable silane compound (B) containing an isocyanate group and the number of moles Y of the hydrolyzable silane compound (B) containing a straight-chain or branched-chain aliphatic alkoxy group having 1 to 5 carbon atoms is preferably 1/99 to 99/1, more preferably 50/50 to 95/5, particularly preferably 60/40 to 90/10.

The content of the hydrolyzable silane compound (B) in the diffusion agent composition is preferably 0.001 to 3.0% by mass, more preferably 0.01 to 1.0% by mass, in terms of Si concentration. When the diffusion agent composition contains the hydrolyzable silane compound (B) at this concentration, external diffusion of the impurity diffusion ingredient (A) from the thin coating film formed using the diffusion agent composition can be well suppressed, and the impurity diffusion ingredient can be diffused well and uniformly into the semiconductor substrate.

[Organic Solvent (S)]

The diffusion agent composition usually contains an organic solvent (S) as a solvent so that a thin coating film can be formed. The type of the organic solvent (S) is not particularly limited as long as the object of the present invention is not impeded.

The diffusion agent composition contains the hydrolyzable silane compound (B) and thus is preferably substantially free from water. The expression "the diffusion agent composition is preferably substantially free from water" means that the diffusion agent composition does not contain water in such an amount that the hydrolysis proceeds to a level that impedes the object of the present invention.

Specific examples of organic solvents (S) include: mono ethers of glycols such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether, and tripropylene glycol monoethyl ether; monoethers such as diisopentyl ether, diisobutyl ether, benzyl methyl ether, benzyl ethyl ether, dioxane, tetrahydrofuran, anisole, perfluoro-2-butyltetrahydrofuran, and perfluorotetrahydrofuran; chain diethers of glycols such as ethylene glycol dimethyl ether, ethylene glycol diethyl ether, ethylene ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether, and dipropylene glycol dibutyl ether; cyclodiethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutyl ketone, cyclohexanone, methylcyclohexanone, phenylacetone, methylethyl ketone, methylisobutyl ketone, ethylisobutyl ketone, acetylacetone, acetonylacetone, ionone, diacetonyl alcohol, acetyl carbinol, acetophenone, methyl naphthyl ketone, and isophorone; esters such as methyl acetate, butyl acetate, ethyl acetate, isopropyl acetate, pentyl acetate, isopentyl acetate, methoxy ethyl acetate, ethoxy ethyl acetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methylpyrubate, ethylpyrubate, propylpyrubate, butyl pyrubate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxy propionate, and isopropyl-3-methoxypropionate, propylene carbonate, and y-butyrolactone; amide-based solvents containing no active hydrogen atom, such as N-methyl-2-pyrrolidone, N,N-dimethylacetamide, N,N-dimethylformamide, hexamethylphosphoric triamide, and 1,3-dimethyl-2-imidazolidinone; sulfoxides such as dimethyl sulfoxide; aliphatic hydrocarbon-based solvents optionally containing a halogen atom such as pentane, hexane, octane, decane, 2,2,4-trimethylpentane, 2,2,3-trimethylhexane, perfluorohexane, perfluoroheptane, limonene, and pinene; aromatic hydrocarbon-based solvents such as benzene, toluene, xylene, ethylbenzene, propylbenzene, 1-methylpropylbenzene, 2-methylpropylbenzene, diethylbenzene, ethylmethylbenzene, trimethylbenzene, ethyldimethylbenzene, and dipropylbenzene; monovalent alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol, and 2-phenoxyethanol; and glycols such as ethylene glycol, propylene glycol, diethylene glycol, and dipropylene glycol. In the above examples of preferred organic solvent (S), organic solvents containing an ether bond and an ester bond are classified in esters. They may be used solely or in a combination of two or more of these.

Since the diffusion agent composition contains the hydrolyzable silane compound (B), organic solvents (S) free from functional groups reactive with the hydrolyzable silane compound (B) are preferred. In particular, when the hydrolyzable silane compound (B) contains an isocyanate group, the organic solvent (S) free from functional groups reactive with the hydrolyzable silane compound (B) is preferred.

Groups reactive with the hydrolyzable silane compound (B) include both of functional groups that react directly with groups capable of producing a hydroxyl group as a result of hydrolysis, and functional groups reactive with a hydroxyl group (a silanol group) as a result of hydrolysis. Functional groups reactive with the hydrolyzable silane compound (B) include, for example, hydroxyl, carboxyl, and amino groups as well as halogen atoms.

Examples of suitable organic solvents free from functional groups reactive with the hydrolyzable silane compound (B) include, among specific examples of the above organic solvents (S), organic solvents recited as specific examples of mono ethers, chain diethers, cyclic diethers, ketones, esters, amide solvents free from an active hydrogen atom, sulfoxides, aliphatic hydrocarbon-based solvents optionally containing halogens, and aromatic hydrocarbon-based solvents.

Other Ingredients

The diffusion agent composition may contain various additives such as surfactants, antifoaming agents, pH adjustors, and viscosity modifiers as long as the object of the present invention is not impeded. Further, the diffusion agent composition may contain binder resins with a view to improving the coatability and film forming properties. Various resins may be used as the binder resin, and acrylic resins are preferred.

Semiconductor Substrate

Various substrates that have hitherto been used as a target of diffusion of an impurity diffusion ingredient may be used as the semiconductor substrate without limitation. Silicon substrates are typically used as the semiconductor substrate.

The semiconductor substrate may have a three-dimensional structure on its surface onto which the diffusion agent composition is to be applied. According to the present invention, even when the semiconductor substrate has on its surface the three-dimensional structure, particularly a three-dimensional structure having a nano-scale micropattern, the impurity diffusion ingredient can be diffused well and uniformly into the semiconductor substrate by coating the diffusion agent composition to form a thin coating film having a thickness of not more than 30 nm on the semiconductor substrate.

The shape of the pattern is not particularly limited, however typical examples thereof include linear or curved lines or grooves of a rectangular cross section and hole shapes formed by removing a circular or rectangular cylindrical shape.

When the semiconductor substrate has on its surface a repeating pattern of a plurality of parallel lines as the three-dimensional structure, an interval between the lines may be not more than 60 nm, not more than 40 nm, or not more than 20 nm. The height of the lines may be not less than 30 nm, not less than 50 nm, or not less than 100 nm.

Coating Method

The diffusion agent composition is applied onto the semiconductor substrate so that the thickness of the coating film formed using the diffusion agent composition is not more than 30 nm, preferably 0.2 to 10 nm. The method for coating the diffusion agent composition is not particularly limited as long as a coating film having a desired thickness can be formed. Preferred coating methods for the diffusion agent composition include spin coating, ink jet coating, and spray coating. The thickness of the coating film is an average of thickness values measured at five or more points with an ellipsometer.

The thickness of the coating film is properly set to any desired thickness of not more than 30 nm depending upon the shape of the semiconductor substrate and an arbitrarily determined degree of diffusion of the impurity diffusion ingredient (A).

After the application of the diffusion agent composition onto the surface of the semiconductor substrate, the surface of the semiconductor substrate is preferably rinsed with an organic solvent. The thickness of the coating film can be made further uniform by rinsing the surface of the semiconductor substrate after the formation of the coating film. In particular, when the semiconductor substrate has on its surface a three-dimensional structure, the thickness of the coating film is likely to be thick at the bottom (stepped portion) of the three-dimensional structure. However, the thickness of the coating film can be made uniform by rinsing the surface of the semiconductor substrate after the formation of the coating film.

Organic solvents that may be contained in the diffusion agent composition may be used as the organic solvent for rinsing.

Diffusion Step

In the diffusion step, the impurity diffusion ingredient (A) contained in the thin coating film formed on the semiconductor substrate using the diffusion agent composition is diffused into the semiconductor substrate. Any method may be used without particular limitation for the diffusion of the impurity diffusion ingredient (A) into the semiconductor substrate as long as the impurity diffusion ingredient (A) can be diffused from the coating film formed of the diffusion agent composition by heating.

A typical method is to heat a semiconductor substrate with a coating film of a diffusion agent composition formed thereon in a heating furnace such as an electric furnace. Conditions for heating are not particularly limited as long as the impurity diffusion ingredient is diffused to a desired extent.

In general, after the removal of organic materials in the coating film by firing under an atmosphere of an oxidizing gas, the semiconductor substrate is heated under an atmosphere of an inert gas to diffuse the impurity diffusion ingredient into the semiconductor substrate.

Heating for the removal of the organic materials by firing is preferably carried out at a temperature of approximately 300 to 1000° C., more preferably 400 to 800° C., preferably for 1 to 120 min, more preferably for 5 to 60 min.

Heating for the diffusion of the impurity diffusion ingredient is preferably carried out at 800 to 1400° C., more preferably at 800 to 1200° C., preferably for 1 to 120 min, more preferably for 5 to 60 min.

When the temperature of the semiconductor substrate can be rapidly raised at 25° C./sec or more to a predetermined diffusion temperature, the holding time of the diffusion temperature may be not more than 30 sec, not more than 10 sec, or even a very short time of less than 1 sec. In this case, the impurity diffusion ingredient can easily be diffused at a high concentration in a shallow region in the surface of the semiconductor substrate.

According to the method of the present invention described above, even when a semiconductor substrate having on its surface a three-dimensional structure with nanoscale microvoids is used, the impurity diffusion ingredient can be diffused well and uniformly into the semiconductor substrate while suppressing the occurrence of defects.

Accordingly, the method according to the present invention is suitable for use in the manufacture of multigate elements having a three-dimensional microstructure. The method according to the present invention can suppress the occurrence of defects in the semiconductor substrate during the diffusion of the impurity diffusion ingredient and thus is particularly suitable for use in the manufacture of CMOS elements such as CMOS image sensors, logic LSI devices.

EXAMPLES

The following Examples further illustrate the present invention but should not be construed as limiting the present invention.

Examples 1 to 12

An impurity diffusion ingredient (Ingredient (A)) and an Si compound (Ingredient (B)) that can produce a silanol group as a result of hydrolysis, of the type and amount specified in Table 1 were dissolved in an organic solvent specified in Table 1. Thus diffusion agent compositions for use in each Example were obtained.

Ingredient (A), Ingredient (B), and organic solvents described in Table 1 are as follows.
(Ingredient (A))
A1: Trimethyl phosphate
A2: Tris(trimethylsilyl) phosphate
A3: Diphosphorus pentaoxide (ethanol solution, concentration 20% by mass)
(Ingredient (B))
B1: tetraisocyanatesilane
B2: tetraethoxysilane
(Organic Solvent)
S1: Butyl acetate
S2: Propylene glycol monomethyl ether For each Example, the diffusion agent composition was applied with a spin coater onto a surface of a silicon substrate having a flat surface (6 in., P type, sheet resistance value: 150 to 160 Ω/sq.). For Examples that are described as "Rinsed" in Table 2, 20 sec after the formation of the coating film, the surface of the silicon substrate was rinsed with butyl acetate.

After the formation of the coating film, treatment was carried out for the diffusion of the impurity diffusion ingredient by the following method.

First, the silicon substrate was placed in the furnace, and the silicon substrate with the coating film formed thereon was held at 550° C. for 30 min in an oxygen atmosphere to remove the organic component on the surface of the silicon substrate by firing. Subsequently, the atmosphere was switched to a nitrogen atmosphere, and the temperature of the furnace was raised from 550° C. to 1000° C. over a time period of 90 min. After the temperature reached 1000° C., the furnace was held at that temperature for a diffusion time period (min) specified in Table 2 to diffuse the impurity diffusion ingredient into the silicon substrate. After the completion of the diffusion treatment, the temperature of the furnace was allowed to fall from 1000° C. to 700° C. over a time period of 30 min. After the silicon substrate was held at 700° C. for 30 min and it was taken out from the furnace.

Regarding the silicon substrate taken out of the furnace, the sheet resistance value was measured at 25 points, and the average of the measured data was calculated. The semiconductor type (P type or N type) of the surface of the silicon substrate after the diffusion treatment was confirmed with a P/N type checker (PN-12α, manufactured by Napson Corporation). The average of the sheet resistance value after the impurity diffusion treatment and the semiconductor type of the surface of the silicon substrate are summarized in Table 2.

TABLE 1

|  | Ingredient (A) | Ingredient (B) | Organic solvent | Molar ratio of P/Si | Si concentration (% by mass) |
|---|---|---|---|---|---|
| Example 1 | A1 | B1 | S1 | 1/1 | 0.05 |
| Example 2 | A1 | B1 | S1 | 1/1 | 0.05 |
| Example 3 | A1 | B1 | S1 | 3/1 | 0.02 |
| Example 4 | A1 | B1 | S1 | 1/1 | 0.05 |
| Example 5 | A1 | B1 | S1 | 3/1 | 0.05 |
| Example 6 | A2 | B1 | S1 | 1/1 | 0.05 |
| Example 7 | A1 | B1 | S1 | 1/1 | 0.10 |
| Example 8 | A3 | B2 | S2 | 0.79/1 | 0.10 |
| Example 9 | A3 | B2 | S2 | 0.79/1 | 0.11 |
| Example 10 | A3 | B2 | S2 | 0.79/1 | 0.11 |
| Example 11 | A3 | B2 | S2 | 0.79/1 | 0.11 |
| Example 12 | A3 | B2 | S2 | 0.79/1 | 0.01 |

TABLE 2

|  | Thickness of coating film (nm) | Rinse | Diffusion time (min.) | Sheet resistance value (Ω/sq.) | Type of semiconductor after diffusion |
|---|---|---|---|---|---|
| Example 1 | 0.4 | Rinsed | 90 | 21.17 | N |
| Example 2 | 5.7 | Not Rinsed | 90 | 48.85 | N |
| Example 3 | 2.6 | Not Rinsed | 90 | 53.19 | N |
| Example 4 | 0.3 | Rinsed | 30 | 84.24 | N |
| Example 5 | 0.9 | Rinsed | 30 | 44.51 | N |
| Example 6 | 2.6 | Rinsed | 30 | 73.48 | N |
| Example 7 | 12.2 | Not Rinsed | 30 | 392.2 | N |
| Example 8 | 17 | Not Rinsed | 30 | 43.70 | N |
| Example 9 | 18.9 | Not Rinsed | 30 | 13.52 | N |
| Example 10 | 0.3 | Rinsed | 30 | 276.5 | N |
| Example 11 | 0.4 | Rinsed | 30 | 45.57 | N |
| Example 12 | 1.6 | Not Rinsed | 30 | 242.7 | N |

As is apparent from Table 2, in Examples 1 to 12, the sheet resistance value of the silicon substrate undergoes a successful change by the diffusion of the impurity diffusion ingredient, and the semiconductor type of the surface of the silicon substrate is converted to N type. That is, it is apparent from Examples 1 to 12 that, in the use of the diffusion agent composition including ingredients specified in Table 1, the impurity diffusion ingredient can be diffused well and uniformly into the semiconductor substrate even when the thickness of the coating film of the diffusion agent composition formed on the surface of the semiconductor substrate is not more than 30 nm.

Accordingly, it can be seen from the Examples that, although the above Examples 1 to 12 are tests using a flat substrate, when diffusion agent compositions as described in Table 1 are used, even in a semiconductor substrate having a nano-scale pattern, the impurity diffusion ingredient can be diffused well and uniformly into the semiconductor substrate by covering the surface of the substrate containing microvoids with a coating film of a diffusion agent composition having an uniform thickness.

Examples 13 and 14

The diffusion agent composition used in Example 1 was applied onto a silicon substrate having on its surface a line-and-space structure with lines having a width of 100 nm and a height of 100 nm being repeatedly arranged at intervals of 60 nm, the silicon substrate being of rectangle in cross section to form a 1.5 nm-thick coating film. After the formation of the coating film, in Example 13, the surface of the silicon substrate was rinsed with butyl acetate while, in Example 14, the rinsing was not carried out.

The cross section of the silicon substrate after the formation of the coating film was observed under a scanning electron microscope (SEM). As a result of SEM observation, it was found that, in both Example 13 and Example 14, the coating film had a substantially uniform thickness. In Example 14 where the rinsing was not carried out, the thickness of the coating film was thicker at the corner of the bottom in the space, and, thus, no edge was observed at the corner of the bottom. On the other hand, in Example 13 where the rinsing was carried out, an edge was clearly observed at the corner of the bottom in the space, and, in the surface of the space portion, the thickness of the coating film was uniform. That is, the thickness of the coating film can be made more uniform by rinsing after the formation of the coating film.

Examples 15 to 18

In Examples 15 and 16, the diffusion agent composition used in Example 8 was used. In Examples 17 and 18, the diffusion agent composition used in Example 12 was used. In the same manner as in Example 13 and 14, a coating film was formed on a silicon substrate having on its surface a line-and-space structure with lines having a width of 100 nm and a height of 100 nm being repeatedly arranged at intervals of 60 nm, the silicon substrate being of rectangle in cross section. After the formation of the coating film, in Example 15, the surface of the substrate was rinsed with propylene glycol monomethyl ether while, in Example 17, the surface of the substrate was rinsed with butyl acetate. In Example 16 and 18, the rinsing was not carried out.

The cross section of the silicon substrate after the formation of the coating film was observed under a scanning electron microscope (SEM). As a result of SEM observation, it was found that, in Example 16, the formed coating film had a substantially uniform thickness of 18.6 nm. In Example 15, the coating film had a substantially uniform thickness of 0.6 nm. In Example 18, the coating film had a substantially uniform thickness of 1.6 nm. In Example 17, the coating film had a substantially uniform thickness of 0.6 nm.

In Examples 16 and 18 where the rinsing was not carried out, the thickness of the coating film was thicker at the corner of the bottom in the space, and, thus, no edge was observed at the corner of the bottom. On the other hand, in Examples 15 and 17 where the rinsing was carried out, it was found that an edge was clearly observed at the corner of the bottom in the space, and, in the surface of the space portion, the thickness of the coating film was uniform.

Examples 19 to 48

An impurity diffusion ingredient (Ingredient (A)) and an Si compound (Ingredient (B)) that can produce a silanol group as a result of hydrolysis, of the type and amount specified in Table 3 were dissolved in an organic solvent specified in Table 3. Thus diffusion agent compositions for use in each Example were obtained.

Ingredient (A), Ingredient (B), and organic solvents described in Table 3 are as follows.

(Ingredient (A))
A4: arsenic acid (ethanol solution, concentration 50% by mass)
A5: tri-n-butoxyarsenic
(Ingredient (B))
B1: tetraisocyanatesilane
B2: tetraethoxysilane
(Organic Solvent)
S1: butyl acetate
S2: propylene glycol monomethyl ether For each Example, the diffusion agent composition was applied with a spin coater onto a surface of a silicon substrate having a flat surface (4 in., P type, sheet resistance value: 180 Ω/sq.). For Examples that are described as "Rinsed" in Table 4, 20 sec after the formation of the coating film, the surface of the silicon substrate was rinsed with butyl acetate.

After the formation of the coating film, treatment was carried out for the diffusion of the impurity diffusion ingredient by the following method.

First, the coating film was baked on a hot plate. Subsequently, the silicon substrate was placed in a furnace that had an inner temperature of 800° C. and a nitrogen atmosphere, and the temperature of the furnace was raised at a temperature rise rate of 10° C./min to a diffusion treatment temperature specified in Table 4. After the diffusion treatment at a predetermined diffusion treatment temperature for a time period (min) specified in Table 4, the furnace temperature was allowed to fall to 700° C. over a time period of about 30 min. After the silicon substrate was held at 700° C. for 30 min and it was taken out from the furnace.

Regarding the silicon substrate taken out of the furnace, the sheet resistance value was measured at 25 points, and the average of the measured data was calculated. The semiconductor type of the surface of the silicon substrate after the diffusion treatment (P type or N type) was confirmed with a P/N type checker (PN-12α, manufactured by Napson Corporation). The average of the sheet resistance value after the impurity diffusion treatment and the semiconductor type of the surface of the silicon substrate are summarized in Table 4.

TABLE 3

| | Ingredient (A) | Ingredient (B) | Organic solvent | Molar ratio of As/Si | Si concentration (% by mass) |
|---|---|---|---|---|---|
| Example 19 | A4 | B2 | S2 | 0.1/1 | 0.10 |
| Example 20 | A4 | B1 | S1 | 0.1/1 | 0.02 |
| Example 21 | A4 | B1 | S1 | 0.1/1 | 0.02 |
| Example 22 | A4 | B1 | S1 | 0.5/1 | 0.02 |
| Example 23 | A4 | B1 | S1 | 0.5/1 | 0.02 |
| Example 24 | A4 | B2 | S2 | 0.1/1 | 0.10 |
| Example 25 | A4 | B1 | S1 | 0.1/1 | 0.02 |
| Example 26 | A4 | B1 | S1 | 0.1/1 | 0.02 |
| Example 27 | A4 | B1 | S1 | 0.5/1 | 0.02 |
| Example 28 | A4 | B1 | S1 | 0.5/1 | 0.02 |
| Example 29 | A5 | B2 | S1 | 0.1/1 | 0.02 |
| Example 30 | A5 | B2 | S1 | 0.1/1 | 0.02 |
| Example 31 | A5 | B2 | S1 | 0.3/1 | 0.02 |
| Example 32 | A5 | B2 | S1 | 0.3/1 | 0.02 |
| Example 33 | A5 | B2 | S1 | 0.5/1 | 0.02 |
| Example 34 | A5 | B2 | S1 | 0.5/1 | 0.02 |
| Example 35 | A5 | B2 | S1 | 0.1/1 | 0.02 |
| Example 36 | A5 | B2 | S1 | 0.1/1 | 0.02 |
| Example 37 | A5 | B2 | S1 | 0.3/1 | 0.02 |
| Example 38 | A5 | B2 | S1 | 0.3/1 | 0.02 |
| Example 39 | A5 | B2 | S1 | 0.1/1 | 0.02 |
| Example 40 | A5 | B2 | S1 | 0.1/1 | 0.02 |
| Example 41 | A5 | B2 | S1 | 0.3/1 | 0.02 |
| Example 42 | A5 | B2 | S1 | 0.3/1 | 0.02 |
| Example 43 | A5 | B2 | S1 | 0.5/1 | 0.02 |
| Example 44 | A5 | B2 | S1 | 0.5/1 | 0.02 |
| Example 45 | A5 | B2 | S1 | 0.1/1 | 0.05 |
| Example 46 | A5 | B2 | S1 | 0.1/1 | 0.05 |
| Example 47 | A5 | B2 | S1 | 0.3/1 | 0.05 |
| Example 48 | A5 | B2 | S1 | 0.3/1 | 0.05 |

TABLE 4

| | Thickness of coating film (nm) | Rinse | Diffusion temperature (° C.) | Diffusion time (min.) | Sheet resistance value (Ω/sq.) | Type of semiconductor after diffusion |
|---|---|---|---|---|---|---|
| Example 19 | 3.8 | Not rinsed | 1000 | 60 | 894.9 | N |
| Example 20 | 2.7 | Not rinsed | 1000 | 60 | 1357 | N |
| Example 21 | 0.1 | Rinsed | 1000 | 60 | 1405 | N |
| Example 22 | 2.5 | Not rinsed | 1000 | 60 | 1434 | N |
| Example 23 | 0.1 | Rinsed | 1000 | 60 | 1509 | N |
| Example 24 | 3.8 | Not rinsed | 1100 | 60 | 101.0 | N |
| Example 25 | 2.7 | Not rinsed | 1100 | 60 | 115.9 | N |
| Example 26 | 0.2 | Rinsed | 1100 | 60 | 119.5 | N |
| Example 27 | 2.5 | Not rinsed | 1100 | 60 | 119.2 | N |
| Example 28 | 0.3 | Rinsed | 1100 | 60 | 126.4 | N |
| Example 29 | 2.5 | Not rinsed | 1000 | 30 | 2024 | N |
| Example 30 | 0.4 | Rinsed | 1000 | 30 | 3225 | N |
| Example 31 | 2.5 | Not rinsed | 1000 | 30 | 1395 | N |
| Example 32 | 1.0 | Rinsed | 1000 | 30 | 2799 | N |
| Example 33 | 2.7 | Not rinsed | 1000 | 30 | 1190 | N |
| Example 34 | 1.2 | Rinsed | 1000 | 30 | 2092 | N |
| Example 35 | 2.1 | Not rinsed | 1000 | 60 | 1108 | N |
| Example 36 | 0.2 | Rinsed | 1000 | 60 | 1334 | N |
| Example 37 | 2.7 | Not rinsed | 1000 | 60 | 790.4 | N |
| Example 38 | 1.2 | Rinsed | 1000 | 60 | 914.7 | N |
| Example 39 | 2.5 | Not rinsed | 1100 | 60 | 430.3 | N |
| Example 40 | 0.4 | Rinsed | 1100 | 60 | 592.4 | N |
| Example 41 | 2.5 | Not rinsed | 1100 | 60 | 367.3 | N |

TABLE 4-continued

|  | Thickness of coating film (nm) | Rinse | Diffusion temperature (° C.) | Diffusion time (min.) | Sheet resistance value (Ω/sq.) | Type of semiconductor after diffusion |
|---|---|---|---|---|---|---|
| Example 42 | 1.0 | Rinsed | 1100 | 60 | 422.0 | N |
| Example 43 | 2.7 | Not rinsed | 1100 | 60 | 326.0 | N |
| Example 44 | 1.2 | Rinsed | 1100 | 60 | 350.9 | N |
| Example 45 | 3.9 | Not rinsed | 1000 | 60 | 944.1 | N |
| Example 46 | 0.2 | Rinsed | 1000 | 60 | 1373 | N |
| Example 47 | 4.2 | Not rinsed | 1000 | 60 | 621.6 | N |
| Example 48 | 0.4 | Rinsed | 1000 | 60 | 588.6 | N |

As is apparent from Table 4, in Examples 19 to 48, the sheet resistance value of the silicon substrate undergoes a successful change by the diffusion of the impurity diffusion ingredient, and the semiconductor type of the surface of the silicon substrate is converted to N type. That is, it is apparent from Examples 19 to 48 that, in the use of the diffusion agent composition having the ingredients specified in Table 3, the impurity diffusion ingredient can be diffused well and uniformly into the semiconductor substrate even when the thickness of the coating film of the diffusion agent composition formed on the surface of the semiconductor substrate was not more than 30 nm.

Accordingly, it can be seen from the Examples that, although the above Examples 19 to 48 are tests using a flat substrate, when diffusion agent compositions as described in Table 3 are used, even in a semiconductor substrate having a nano-scale pattern, the impurity diffusion ingredient can be diffused well and uniformly into the semiconductor substrate by covering the surface of the substrate containing microvoids with a coating film of a diffusion agent composition having an uniform thickness.

Examples 49 and 50

The diffusion agent composition used in Example 31 was applied onto a silicon substrate having on its surface a line-and-space structure with lines having a width of 100 nm and a height of 100 nm being repeatedly arranged at intervals of 60 nm, the silicon substrate being of rectangle in cross section to form a 1.5 nm-thick coating film. After the formation of the coating film, in Example 49, the surface of the silicon substrate was rinsed with butyl acetate while, in Example 50, the rinsing was not carried out.

The cross section of the silicon substrate after the formation of the coating film was observed under a scanning electron microscope (SEM). As a result of SEM observation, it was found that, in both Example 49 and Example 50, the coating film had a substantially uniform thickness. In Example 50 where the rinsing was not carried out, the thickness of the coating film was thicker at the corner of the bottom in the space, and, thus, no edge was observed at the corner of the bottom. On the other hand, in Example 49 where the rinsing was carried out, an edge was clearly observed at the corner of the bottom in the space, and, even in the surface of the space portion, the thickness of the coating film was uniform. That is, the thickness of the coating film can be more uniform by rinsing after the formation of the coating film.

Example 51

A5: tri-n-butoxyarsenic was used as the impurity diffusion ingredient (Ingredient (A)). The following B1 and B2 were used as the Si compound (Ingredient (B)) that can produce a silanol group as a result of hydrolysis.
(Ingredient (B))
B1: tetraisocyanatesilane
B2: tetraethoxysilane A diffusion agent composition was obtained by dissolving tri-n-butoxyarsenic, tetraisocyanatesilane, and tetraethoxysilane in butyl acetate so that the concentrations of the ingredients were as described below.
Concentration of Each Ingredient
(A5) tri-n-butoxyarsenic: concentration 0.24% by mass
(B1) tetraisocyanatesilane: concentration 0.28% by mass
(B2) tetraethoxysilane: concentration 0.075% by mass The diffusion agent composition was applied with a spin coater onto a surface of a silicon substrate having a flat surface (6 in., P type, sheet resistance value: 160 Ω/sq.) to form a 5.6 nm-thick coating film.

After the formation of the coating film, treatment was carried out for the diffusion of the impurity diffusion ingredient by the following method.

First, the coating film was baked on a hot plate. Subsequently, the silicon substrate was heated with a rapid thermal annealing apparatus manufactured by ULVAC, Inc. (MILA-3000, lamp annealing apparatus) under a nitrogen atmosphere at a flow rate of 1 L/m under condition of a temperature rise rate of 25° C/sec and was subjected to diffusion under conditions of a diffusion temperature of 1000° C. and a holding time of 5 sec. The start point of the holding time is a point at which the temperature of the substrate reached a predetermined diffusion temperature. After the completion of the diffusion, the semiconductor substrate was rapidly cooled to room temperature.

For the substrate subjected to the impurity diffusion treatment, the sheet resistance value was measured and was found to be 368.6 (Ω/sq.). Further, As surface concentration (atoms/cm$^2$) was measured with a quadrupolar secondary ion mass analyzer (Q-SIMS) and was found to be 3.9E+14 (atom/cm$^2$).

As is apparent from the above result, even when a combination of an alkoxysilane compound with an isocyanatesilane compound was used as Ingredient (B), the impurity diffusion ingredient can be well diffused from the thin film of the diffusion agent composition having a thickness of not more than 30 nm into the surface of the silicon substrate.

Further, it was found that, even when the holding time at a predetermined diffusion temperature in diffusion treatment was a very short time period of 5 sec, the impurity diffusion ingredient can be well diffused.

The relationship between the diffusion depth and the As amount (atoms/cc) after the diffusion was measured with a Q-SIMS apparatus. As a result, it was found that, at the depth of 40 nm from the surface of the substrate, the As amount was 1.0E+17 (atoms/cc), indicating that As was diffused at a high concentration.

That is, according to the method of the present invention, the impurity diffusion ingredient can be diffused at a high concentration in a shallow region in the surface of the substrate.

Example 52

A6: trimethoxyboron was used as the impurity diffusion ingredient (Ingredient (A)). The following B1 and B2 were used as the Si compound (Ingredient (B)) that can produce a silanol group as a result of hydrolysis.
(Ingredient (B))
B1: tetraisocyanatesilane
B2: tetraethoxysilane A diffusion agent composition was obtained by dissolving trimethoxyboron, tetraisocyanatesilane, and tetraethoxysilane in butyl acetate so that the concentrations of the ingredients were as described below.
Concentration of Each Ingredient
    (A6) trimethoxyboron: concentration 0.72% by mass
    (B1) tetraisocyanatesilane: concentration 0.734% by mass
    (B2) tetraethoxysilane: concentration 0.334% by mass The diffusion agent composition was applied with a spin coater onto a surface of a silicon substrate having a flat surface (6 in., N type, sheet resistance value 200 Ω/sq.) to form a 11.8 nm-thick coating film.

After the formation of the coating film, treatment was carried out for the diffusion of the impurity diffusion ingredient in the same manner as in Example 51.

For the substrate subjected to the impurity diffusion treatment, the sheet resistance value was measured and was found to be 1665 (Ω/sq.). Further, B (boron) surface concentration (atoms/cm$^2$) was measured with a quadrupolar secondary ion mass analyzer (Q-SIMS) and was found to be 2.0E+13 (atom/cm$^2$).

As is apparent from the above result, even when a combination of an alkoxysilane compound with an isocyanatesilane compound was used as Ingredient (B), the impurity diffusion ingredient can be well diffused from the thin film of the diffusion agent composition having a thickness of not more than 30 nm into the surface of the silicon substrate.

Further, it was found that, even when boron compounds are used as the impurity diffusion ingredient, the impurity diffusion ingredient can be well diffused by diffusion treatment even in a very short time period of 5 sec.

What is claimed is:

1. A method for manufacturing a semiconductor substrate into which an impurity diffusion ingredient is diffused, the method comprising:
    forming a coating film having a thickness of not more than 30 nm by coating a diffusion agent composition onto a semiconductor substrate;
    diffusing the impurity diffusion ingredient contained in the diffusion agent composition into the semiconductor substrate, wherein the diffusion agent composition comprises the impurity diffusion ingredient and a silicon compound, wherein the silicon compound is a compound represented by the following formula (1):

$$R_{4-n}Si(NCO)_n \qquad (1)$$

wherein R represents a hydrocarbon group; and n is an integer of 3 or 4 and can be hydrolyzed to produce a silanol group.

2. The method according to claim 1, wherein the coating film has a thickness of 0.2 to 10 nm.

3. The method according to claim 1, wherein the semiconductor substrate has a three-dimensional structure having convexes and concaves on a surface of the semiconductor substrate; and the diffusion agent composition is applied onto the surface.

4. The method according to claim 3, comprising rinsing the coating film with an organic solvent.

5. The method according to claim 1, further comprising rinsing the coating film with an organic solvent.

6. A diffusion agent composition comprising:
    an impurity diffusion ingredient and
    a silicon compound, wherein the silicon compound can be hydrolyzed to produce a silanol group, and is represented by the following formula (1):

$$R_{4-n}Si(NCO)_n \qquad (1)$$

wherein R represents a hydrocarbon group; and n is an integer of 3 or 4.

* * * * *